(12) United States Patent
Chen et al.

(10) Patent No.: US 12,142,710 B2
(45) Date of Patent: Nov. 12, 2024

(54) MICRO LIGHT-EMITTING DIODE DISPLAY DEVICE

(71) Applicant: PlayNitride Display Co., Ltd., Zhunan Township, Miaoli County (TW)

(72) Inventors: Yen-Yeh Chen, Zhunan Township, Miaoli County (TW); Sheng-Yuan Sun, Zhunan Township, Miaoli County (TW)

(73) Assignee: PLAYNITRIDE DISPLAY CO., LTD., Miaoli County (TW)

( * ) Notice: Subject to any disclaimer, the term of this patent is extended or adjusted under 35 U.S.C. 154(b) by 422 days.

(21) Appl. No.: 17/543,305

(22) Filed: Dec. 6, 2021

(65) Prior Publication Data

US 2023/0058551 A1    Feb. 23, 2023

(30) Foreign Application Priority Data

Aug. 20, 2021 (TW) ................. 110130934

(51) Int. Cl.
| | |
|---|---|
| *H01L 33/50* | (2010.01) |
| *H01L 25/075* | (2006.01) |
| *H01L 33/60* | (2010.01) |
| *H01L 33/62* | (2010.01) |

(52) U.S. Cl.
CPC ........ *H01L 33/505* (2013.01); *H01L 25/0753* (2013.01); *H01L 33/60* (2013.01); *H01L 33/62* (2013.01)

(58) Field of Classification Search
None
See application file for complete search history.

(56) References Cited

U.S. PATENT DOCUMENTS

| | | | |
|---|---|---|---|
| 2012/0074441 A1* | 3/2012 | Seo | H01L 33/42 257/E33.068 |
| 2014/0209955 A1* | 7/2014 | Kim | H01L 33/62 257/99 |
| 2018/0350871 A1* | 12/2018 | Lee | H01L 33/504 |
| 2019/0355785 A1* | 11/2019 | Wu | H01L 33/62 |

(Continued)

FOREIGN PATENT DOCUMENTS

| | | |
|---|---|---|
| TW | I-667643 B | 8/2019 |
| TW | I-707491 B | 10/2020 |

(Continued)

*Primary Examiner* — Scott B Geyer
(74) *Attorney, Agent, or Firm* — Muncy, Geissler, Olds & Lowe, P.C.

(57) ABSTRACT

A micro LED display device includes a circuit substrate, an epitaxial structure layer, a metal conductive layer, a light conversion layer and a light-shielding structure. The epitaxial structure layer includes a first surface, a second surface, and a plurality of micro LED units separated from each other. The micro LED units are electrically connected to the circuit substrate. The metal conductive layer is disposed on the second surface and directly contacts the epitaxial structure layer, and has a plurality of light conversion region each corresponds to one of the micro LED units. The light conversion layer is disposed in a part of the light conversion regions. The light-shielding structure does not cover the light conversion regions. In the direction perpendicular to a bonding surface of the circuit substrate, the thickness of the metal conductive layer is greater than that of the epitaxial structure layer.

23 Claims, 12 Drawing Sheets

(56) References Cited

U.S. PATENT DOCUMENTS

| | | | |
|---|---|---|---|
| 2020/0035748 A1* | 1/2020 | Xia | H01L 27/156 |
| 2020/0105724 A1* | 4/2020 | Lee | H01L 33/504 |
| 2020/0212022 A1* | 7/2020 | Ahmed | H01L 33/62 |
| 2020/0258869 A1* | 8/2020 | Wu | H01L 33/60 |
| 2021/0126160 A1* | 4/2021 | Andrews | H01L 33/50 |
| 2022/0115564 A1* | 4/2022 | Jeon | H01L 33/42 |
| 2022/0231081 A1* | 7/2022 | Kim | H01L 33/20 |

FOREIGN PATENT DOCUMENTS

| | | |
|---|---|---|
| TW | I-709222 B | 11/2020 |
| TW | I-720772 B | 3/2021 |
| TW | 202115897 A | 4/2021 |
| TW | I-725691 B | 4/2021 |
| TW | I-736455 B | 8/2021 |

\* cited by examiner

MICRO LIGHT-EMITTING DIODE DISPLAY DEVICE

CROSS REFERENCE TO RELATED APPLICATIONS

This Non-provisional application claims priority under 35 U.S.C. § 119(a) on Patent Application No(s). 110130934 filed in Taiwan, Republic of China on Aug. 20, 2021, the entire contents of which are hereby incorporated by reference.

BACKGROUND

Technology Field

This disclosure relates to a display device and, in particular, to a micro light-emitting diode (LED) display device.

Description of Related Art

Now the world is paying attention to the future display technology, and micro light-emitting diode (micro LED) is one of the most promising technologies. In brief, micro LED is a technology of miniaturizing and matrixing LED, thereby arranging millions or even tens of millions of dies, which are smaller than 100 microns and thinner than a hair, on a substrate. Compared with the current OLED (organic light-emitting diode) display technology, micro LED display device is also a self-luminous device but utilizes different material. Therefore, the micro LED display device can solve the screen burn-in issue, which is the most deadly problem in OLED display device. Besides, micro LED display device further has the advantages of low power consumption, high contrast, wide color gamut, high brightness, small and thin size, light weight and energy saving. Therefore, major factories around the world are scrambling to invest in the research and development of micro LED technology.

In order to obtain uniform brightness and reduce power consumption, the conventional micro LED display device generally utilizes the conductive structure with metal grid to electrically connect the semiconductor layer of the micro LED to the driving substrate. However, under the requirements of high-resolution (high PPI, such as UHD, AR/VR) display devices, the manufacturing process tolerance of metal grids formed in the semiconductor layer of relatively small micro LEDs will be lower, which directly affects the manufacturing yield of the display devices.

Therefore, it is desired to provide a micro LED display device that can meet the requirements of high resolution and has a high manufacturing yield.

SUMMARY

One or more exemplary embodiments of this disclosure are to provide a micro LED display device that can meet the requirements of high resolution and have a higher manufacturing yield.

In an exemplary embodiment, a micro LED display device includes a circuit substrate, an epitaxial structure layer, a metal conductive layer, a light conversion layer, and a light-shielding structure. The circuit substrate has a bonding surface. The epitaxial structure layer is disposed on the bonding surface of the circuit substrate. The epitaxial structure layer includes a first surface facing the circuit substrate, a second surface away from the circuit substrate, and a plurality of micro LED units separated from each other. The micro LED units are located on the first surface and electrically connected to the circuit substrate, and the circuit substrate controls the micro LED units to emit light. The metal conductive layer is disposed on the second surface of the epitaxial structure layer and directly contacts the epitaxial structure layer. The metal conductive layer defines a plurality of light conversion regions separated from each other, and each of the light conversion regions corresponds to one of the micro LED units. The light conversion layer is disposed in a part of the light conversion regions and is configured to convert wavelengths of lights emitted from the corresponding micro LED units. The light-shielding structure has a plurality of first light-shielding portions disposed on the metal conductive layer, and the first light-shielding portions do not cover the light conversion regions. In the direction perpendicular to the bonding surface of the circuit substrate, the thickness of the metal conductive layer is greater than that of the epitaxial structure layer.

In one embodiment, the second surface of the epitaxial structure layer is a planar surface.

In one embodiment, each of the light conversion regions is a through hole formed in the metal conductive layer.

In one embodiment, the through hole is overlapped with the corresponding micro LED unit in the direction perpendicular to the bonding surface, and the light emitted from the micro LED unit passes through the through hole to display an image.

In one embodiment, the epitaxial structure layer includes a continuous semiconductor layer commonly applied to the micro LED units.

In one embodiment, the circuit substrate further includes a plurality of conductive electrodes, and one of the conductive electrodes is electrically connected to one of the micro LED units via a conductive member.

In one embodiment, the circuit substrate outputs a common-electrode signal to the metal conductive layer through the conductive member and the epitaxial structure layer.

In one embodiment, the light-shielding structure further includes a plurality of second light-shielding portions disposed on the second surface of the epitaxial structure layer, and the second light-shielding portions expose parts of area of the second surface of the epitaxial structure layer which are corresponding to parts of the micro LED units.

In one embodiment, a gap is configured between one of the second light-shielding portions and one of the light conversion regions adjacent to the second light-shielding portion.

In one embodiment, the micro LED display device further includes a transparent layer disposed at one side of the light-shielding structure away from the metal conductive layer.

In one embodiment, a part of the material of the transparent layer is filled in the light conversion regions, which are not configured with the light conversion layer.

In one embodiment, the micro LED display device further includes a light filter layer disposed at one side of the light conversion layer away from the epitaxial structure layer. The light filter layer includes a plurality of light filter portions, the light conversion layer includes a plurality of light conversion portions, and the light filter portions are disposed corresponding to the light conversion portions, respectively.

In one embodiment, a cross-sectional shape of each light conversion portion is an inverted trapezoid shape.

In one embodiment, the epitaxial structure layer further includes a plurality of protrusion portions protruding toward the light conversion layer, and each of the protrusion portions is disposed corresponding to one of the micro LED units.

In one embodiment, the light conversion layer includes a plurality of light conversion portions, a cross-sectional shape of each of the light conversion portions is an inverted trapezoid shape, and a cross-sectional shape of each of the protrusion portions is a trapezoid shape.

In one embodiment, the protrusion portions are isolated from each other.

In one embodiment, the protrusion portions in the same one pixel are connected to each other, and adjacent two of the protrusion portions in two adjacent pixels, respectively, are isolated from each other.

In one embodiment, the light conversion layer includes a top surface away from the epitaxial structure layer, the metal conductive layer includes an upper surface away from the epitaxial structure layer, and the top surface is aligned with the upper surface.

In one embodiment, the micro LED display device further includes a plurality of light-reflective structures correspondingly disposed on sidewalls of the micro LED units, respectively, wherein each of the light-reflective structures is configured to reflect a light emitted from the corresponding micro LED unit.

In one embodiment, each of the light-reflective structures is disposed around a light-emitting layer of the corresponding micro LED unit.

In one embodiment, the micro LED display device further includes a light-reflective layer correspondingly disposed at lateral sides of each of the light conversion regions.

In one embodiment, the epitaxial structure layer further includes a plurality of protrusion portions protruding toward the light conversion layer, each of the protrusion portions is disposed corresponding to one of the micro LED units, and the light-reflective layer extends from the lateral sides of each of the light conversion regions to an outer surface of each of the protrusion portions.

In one embodiment, the reflectivity of the light-reflective layer is greater than that of the metal conductive layer.

As mentioned above, the micro LED display device of this disclosure utilizes a thicker metal conductive layer to conduct the current flowing through each micro LED unit instead of utilizing the conventional metal grid to electrically connect the micro LED units to the driving substrate. This configuration can improve the lighting efficiency of micro LED units, obtain the uniform brightness, and reduce the power consumption. Compared with the conventional art that utilizes the metal grid to electrically connect the micro LED units to the driving substrate, the micro LED display device of this disclosure can meet the requirements of high resolution and have a higher manufacturing yield.

BRIEF DESCRIPTION OF THE DRAWINGS

The disclosure will become more fully understood from the detailed description and accompanying drawings, which are given for illustration only, and thus are not limitative of the present disclosure, and wherein.

DETAILED DESCRIPTION OF THE DISCLOSURE

The present disclosure will be apparent from the following detailed description, which proceeds with reference to the accompanying drawings, wherein the same references relate to the same elements.

Figure 1A:
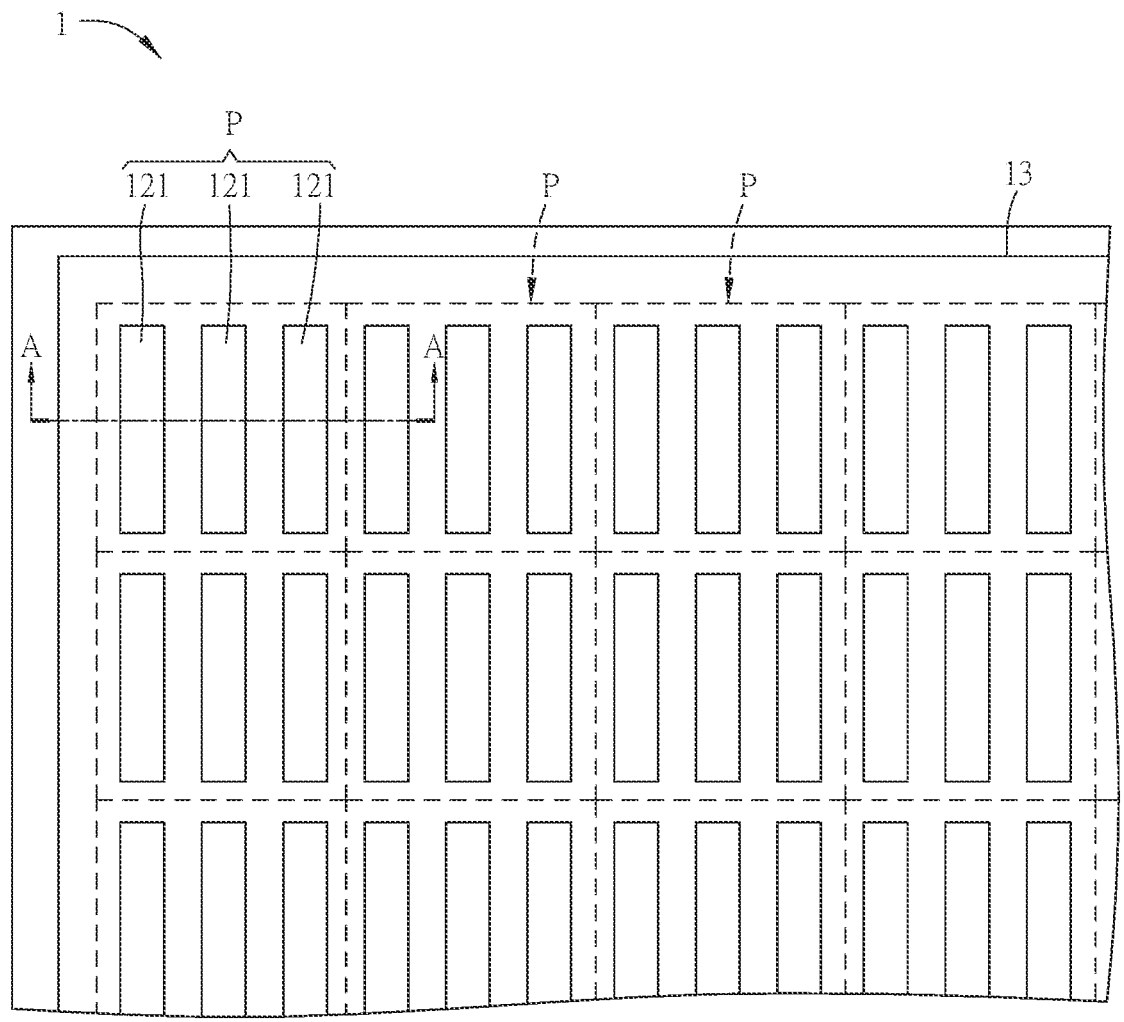
FIG. 1A is a schematic diagram showing a micro LED display device according to an embodiment of this disclosure.
Figure 1B:
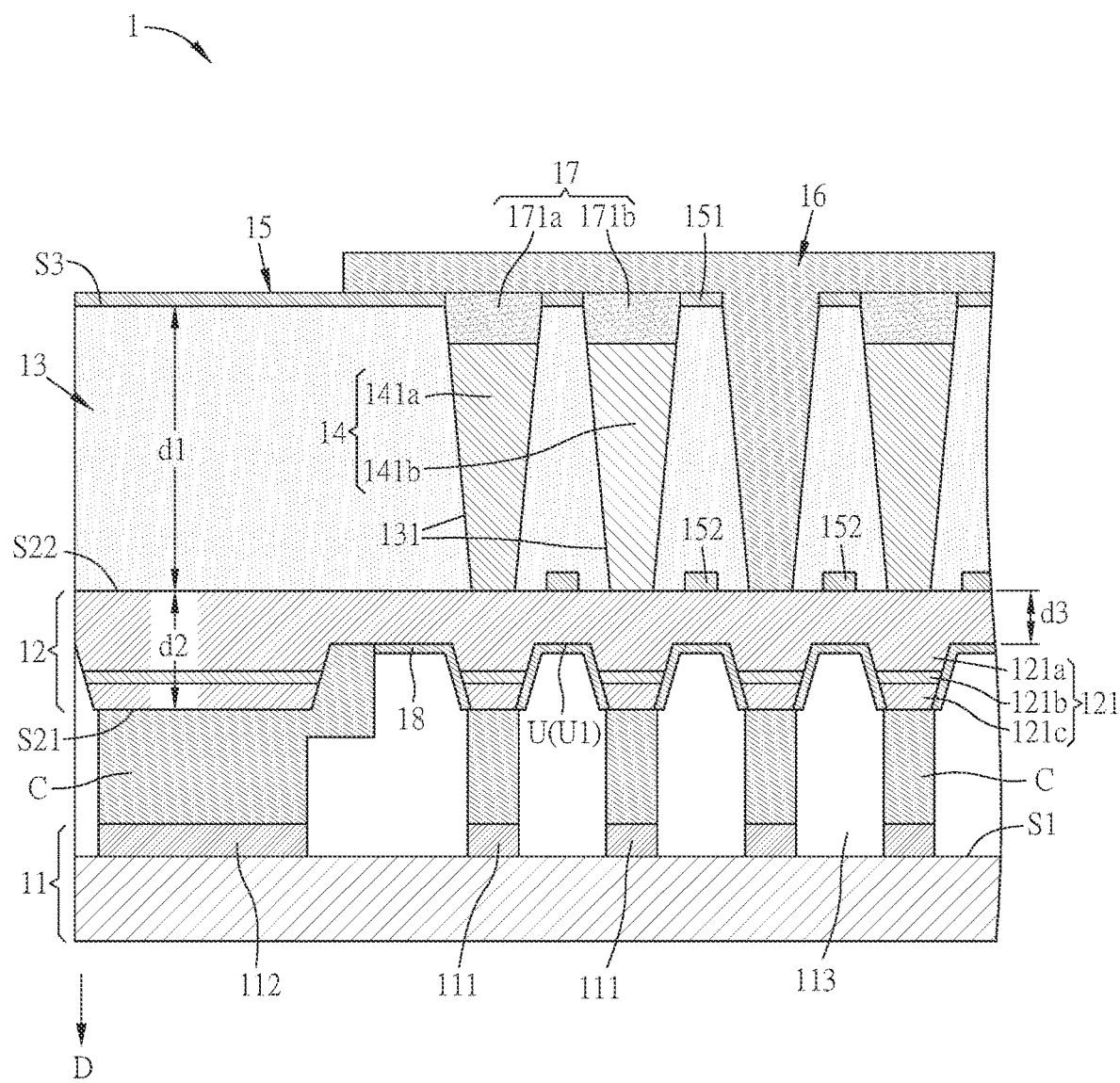
FIG. 1B is a sectional view of the micro LED display device of FIG. 1A along the line A-A.
Figure 1C:
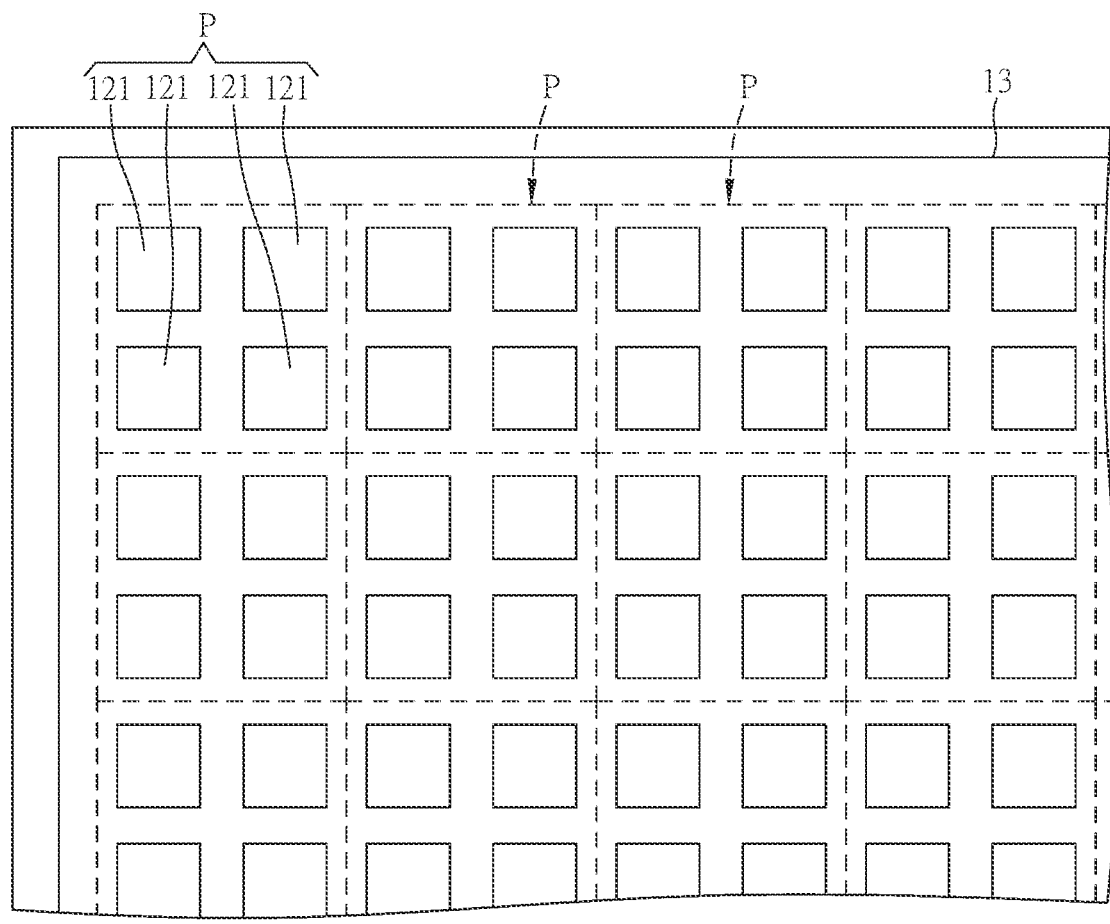
FIG. 1C is a schematic diagram showing a micro LED display device according to another embodiment of this disclosure.

FIG. 1A is a schematic diagram showing a micro LED display device according to an embodiment of this disclosure, FIG. 1B is a sectional view of the micro LED display device of FIG. 1A along the line A-A, and FIG. 1C is a schematic diagram showing a micro LED display device according to another embodiment of this disclosure.

Referring to FIGS. 1A and 1C, the micro LED display device 1 includes a plurality of pixels P, and the pixels P are arranged in an array (rows and columns). As shown in FIG. 1A, each pixel P of this embodiment includes three sub-pixels arranged side by side, and each sub-pixel includes a micro LED unit 121. That is, each pixel P includes three micro LED units 121 arranged side by side. In other embodiments, the three sub-pixels in each pixel P can be arranged in a different way. For example, two of the three sub-pixels are arranged up and down, and the third one of the three sub-pixels is located beside the other two sub-pixels. Other arrangements are acceptable. In different embodiments, each pixel P may include four or more sub-pixels. Taking the pixel P including four sub-pixels as an example, the four sub-pixels can be arranged side by side, or in a 2*2 array, or any of other suitable arrangements. Referring to FIG. 1C, the four sub-pixels in each pixel P are arranged in a 2*2 array. For example, each of the upper two sub-pixels includes a green micro LED unit 121, and the lower two sub-pixels include a blue micro LED unit 121 and a red micro LED unit 121, respectively. This disclosure is not limited thereto.

Referring to FIG. 1B, the micro LED display device 1 of this embodiment can be an active matrix (AM) LED micro display device or a passive matrix (PM) LED micro display device. The micro LED display device 1 includes a circuit substrate 11, an epitaxial structure layer 12, a metal conductive layer 13, a light conversion layer 14 and a light-shielding structure 15.

The circuit substrate 11 has a bonding surface S1. In this embodiment, the bonding surface S1 is the upper surface of the circuit substrate 11. The circuit substrate is a driving substrate for driving the micro LED units 121 to emit light. For example, the circuit substrate 11 may be a complementary metal-oxide-semiconductor (CMOS) substrate, a liquid crystal on silicon (LCOS) substrate, or a thin-film transistor (TFT) substrate, or any of other driving substrates with working circuits, but this disclosure is not limited thereto. In some embodiments, the micro LED display device of this disclosure is a micro display applied to AR or VR applications. The length of the circuit substrate 11 can be, for example but not limited to, less than or equal to 1 inch, and the PPI (pixels per inch) thereof can be greater than 1000. In other embodiments, the length of the circuit substrate 11 can be greater than 1 inch, and the PPI thereof is not limited.

The epitaxial structure layer 12 is disposed on the bonding surface S1 of the circuit substrate 11. In this embodiment, the epitaxial structure layer 12 includes a first surface S21 facing the circuit substrate 11, a second surface S22 away from the circuit substrate 11, and a plurality of micro LED units 121 separated from each other and facing the circuit substrate 11. The micro LED units 121 are located on the first surface S21 and electrically connected to the circuit substrate 11, and the circuit substrate 11 controls (drives) the micro LED units 121 to emit light. In particular, the first surface S21 of the epitaxial structure layer 12 is formed with a plurality of recess portions U so as to separate the micro LED units 121, which are arranged in an array. The micro LED units 121 can be individually controlled to emit light. The second surface S22 of the epitaxial structure layer 12 directly contacts the metal conductive layer 13.

In this embodiment, each micro LED unit 121 can provide the light source for one corresponding sub-pixel. Each micro LED unit 121 includes a first type semiconductor layer 121a, a light-emitting layer 121b, and a second type semiconductor layer 121c, which are stacked in order. The light-emitting layer 121b is sandwiched between the first type semiconductor layer 121a and the second type semiconductor layer 121c. The depth of the recess portion U is greater than the total thickness of the second type semiconductor layer 121c and the light-emitting layer 121b. In this case, the first type semiconductor layer 121a is an N-type semiconductor layer. Specifically, the epitaxial structure layer 12 includes one continuous first type semiconductor layer 121a, and the micro LED units 121 commonly utilizes the same one first type semiconductor layer 121a. To be noted, this disclosure is not limited thereto. In addition, the second type semiconductor layer 121c is a P-type semiconductor layer, and the light-emitting layer 121b is, for example, a multiple quantum well (MQW) layer. This disclosure is not limited thereto. In different embodiments, the first type semiconductor layer 121a can be a P-type semiconductor layer, the second type semiconductor layer 121c can be an N-type semiconductor layer. In this case, the micro LED units 121 commonly utilizes the same P-type semiconductor layer.

In addition, the circuit substrate 11 further includes a plurality of conductive electrodes (111, 112), which are disposed corresponding to the micro LED units 121 of the epitaxial structure layer 12 (e.g. in the one-to-one arrangement). In this embodiment, each conductive electrode is electrically connected to the corresponding circuit layer (not shown) of the circuit substrate 11, and a dielectric layer (not shown) is provided between two adjacent conductive electrodes. Accordingly, the circuit substrate 11 can transmit the individually controlled electric signal to the conductive electrode through the corresponding circuit layer, thereby driving the corresponding micro LED unit 121 to emit light.

One of the conductive electrodes can be electrically connected to one of the micro LED units 121 via a conductive member C. The conductive electrodes of this embodiment may include a plurality of first electrodes 111 (FIG. 1B shows four first electrodes 111) and a second electrode 112. Each first electrode 111 is electrically connected to the second type semiconductor layer 121c of one corresponding micro LED unit 121 via one corresponding conductive member C, and the second electrode 112 is the common electrode of the epitaxial structure layer 12 and is electrically connected to the first semiconductor layers 121a of the corresponding micro LED units 121 via one corresponding conductive member C. The above-mentioned conductive members C can include, for example but not limited to, indium, tin, copper, silver, gold, or an alloy thereof (e.g., copper plus any of the above-mentioned metals (excluding tin)), and this disclosure is not limited. In addition, excepting the areas contacting the conductive members C, the residual surfaces of the micro LED units 121 facing the circuit substrate 11 are configured with an insulation layer 18 for protecting the structure of the micro LED units 121. In other words, the parts of the first surface S21 of the epitaxial structure layer 12, which do not contact the conductive members C, are configured with the insulation layer 18. In some embodiments, the circuit substrate 11 further includes a solder resist layer 113 disposed between the bonding surface S1 and the epitaxial structure layer 12. The solder resist layer 113 can not only provide a buffer during the pressing process to prevent the epitaxial structure layer 12 from breaking, but also prevent a short circuit between the first electrodes 111. The material of the solder resist layer 113 may include, for example but is not limited to, an inorganic dielectric material (e.g., silicon nitride or silicon oxide), or an organic polymer material (e.g., photoresist or ink). To be noted, in order to obtain uniform brightness and reduce power consumption, the micro LED display device 1 of this embodiment does not use a conventional metal grid to electrically connect the semiconductor layer (e.g., the first type semiconductor layer 121a) of the micro LED unit to the driving substrate.

The metal conductive layer 13 is disposed on the second surface S22 of the epitaxial structure layer 12, which is away from the circuit substrate 11, and directly contacts the epitaxial structure layer 12. In this embodiment, the second surface S22 of the epitaxial structure layer 12 is a planar surface and is substantially parallel to the bonding surface S1 of the circuit substrate 11. The metal conductive layer 13 directly contacts the first type semiconductor layer 121a of the epitaxial structure layer 12 so as to electrically connect to the micro LED units 121. In addition, the metal conductive layer 13 is also electrically connected to the circuit substrate 11. For example, the metal conductive layer 13 is electrically connected to the second electrode 112 of the circuit substrate 11. In some embodiments, in the direction D perpendicular to the bonding surface S1 of the circuit substrate 11, the shortest distance between the light-emitting layer 121b and the second surface S22 of the epitaxial structure layer 12 is greater than 1 μm and less than 4 μm. Moreover, the thickness d3 from the bottom U1 of the recess portion U to the second surface S22 of the epitaxial structure layer 12 is less than 3 μm. In this embodiment, the thickness d3 must be limited. If the thickness d3 is too large, the current transmission will get worse. In other words, the thinner thickness d3 can make the current signals (the electric signals of the common electrode in this embodiment) flow to the metal conductive layer 13 through the conductive member C and the epitaxial structure layer 12 much easier, and then current signals can uniformly flow to the entire display area via the high-conductivity metal conductive layer 13.

In addition, the metal conductive layer 13 defines a plurality of light conversion regions 131 separated from each other, and each of the light conversion regions 131 corresponds to one of the micro LED units 121. In other words, the light conversion regions 131 correspond to the micro LED units 121 respectively (in the one-to-one manner). In this embodiment, each light conversion region 131 is overlapped with the corresponding micro LED unit 121 in the direction D perpendicular to the bonding surface S1. In this case, each light conversion region 131 is a through hole formed in the metal conductive layer 13, which communicates the upper surface and the lower surface of the metal conductive layer 13. Accordingly, the light emitted from the micro LED unit 121 corresponding to the light conversion region 131 can pass through the through hole (the light conversion region 131) and be outputted upwardly. In brief, the light emitted from the micro LED unit 121 can pass through the through hole to display the image. The material of the metal conductive layer 13 includes, for example, copper, silver, aluminum, titanium, chromium, nickel, or any alloy thereof.

The light conversion layer 14 is disposed in a part of the light conversion regions 131, and the light conversion layer 14 is configured to convert the wavelengths of lights emitted from the corresponding micro LED units 121. In this embodiment, the light conversion layer 14 includes a plurality of separated light conversion portions 141*a* and 141*b*, which are located in the corresponding light conversion regions 131, respectively. Each light conversion portion 141*a* or 141*b* corresponds to one of the micro LED unit 121. Specifically, in three sub-pixels of one pixel P, the light conversion regions 131 in two sub-pixels are filled with the materials of light conversion portions 141*a* and 141*b* for converting the lights into different wavelengths. Herein, the light conversion layer 14 (the light conversion portion 141*a* or 141*b*) includes a light conversion material, such as quantum dots, phosphorescent material or fluorescent material. In this embodiment, the light conversion material includes quantum dots, which can form the light conversion portions 141*a* and 141*b*. The quantum dots of different sizes can be excited to produce lights of different colors. For example, the quantum dots of different sizes can be excited by blue light to produce red light and green light. The shape of the light conversion portions 141*a* and 141*b* of the present embodiment is, for example, an inverted cone shape, and the cross-sectional shape thereof is, for example, a polygonal shape (e.g., an inverted trapezoid shape). Certainly, this disclosure is not limited thereto.

In this embodiment, the micro LED display device 1 further includes a light filter layer 17 disposed at one side of the light conversion layer 14 away from the epitaxial structure layer 12. The light filter layer 17 is partially filled into the light conversion regions 131. The light filter layer 17 includes a plurality of light filter portions 171*a* and 171*b*, and the light filter portions 171*a* and 171*b* are disposed corresponding to and overlapped with the light conversion portions 141*a* and 141*b*, respectively (in one-to-one manner). In practice, after the metal conductive layer 13 defines the plurality of separated light conversion regions 131, the material of the light conversion portions 141*a* and 141*b* and the material of the light filter portions 171*a* and 171*b* are disposed in the corresponding light conversion regions 131 in order. Accordingly, the light conversion portion 141*a* and the light filter portion 171*a* can be formed corresponding to one of the micro LED units 121 (i.e., the region of one sub-pixel). The light filter portions 171*a* and 171*b* may include different light filter materials for different color lights, such as a red light filter material and a green light filter material, respectively. Accordingly, in each of the light conversion regions 131 corresponding to the light conversion portions 141*a* and 141*b* and the light filter portions 171*a* and 171*b*, the light (e.g. blue light) emitted from the corresponding sub-pixel (i.e., the corresponding micro LED unit 121) can be converted by the corresponding light conversion portion (141*a* or 141*b*) to emit the desired color light (e.g., red light or green light), which will pass through the corresponding light filter portion (171*a* or 171*b*) and then being outputted. In other embodiments, for example, if the thickness of the light conversion portions 141*a* and 141*b* is large enough to make the color purity of light reach the requirement, it is possible to remove the light filter layer 17 (the light filter portions 171*a* and 171*b*). In addition, when a thicker light conversion layer 14 (the light conversion portions 141*a* and 141*b*) is used to obtain a higher color purity of light, a thicker metal conductive layer 13 is also needed. In different embodiments, the micro LED units 121 may be cooperated with other corresponding light conversion portions (and/or light filter portions) so as to emit the light of different color (e.g., yellow light or white light), but this disclosure is not limited thereto. To be noted, the "thickness" or "height" mentioned in this disclosure refers to the maximum thickness or the maximum height in the direction D perpendicular to the bonding surface S1 of the circuit substrate 11 or the second surface S22.

The light-shielding structure 15 is patterned and formed on at least one side of the metal conductive layer 13. In this embodiment, the light-shielding structure 15 includes a plurality of first light-shielding portions 151 and a plurality of second light-shielding portions 152, and the first light-shielding portions 151 and the second light-shielding portions 152 are disposed at two opposite sides of the metal conductive layer 13. The first light-shielding portions 151 are disposed on an upper surface S3 of the metal conductive layer 13 away from the epitaxial structure layer 12, and are located around the light conversion regions 131. In other words, the first light-shielding portion 151 does not block the corresponding light conversion region 131 (the light conversion portion 141*a*, 141*b* or the light filter portion 171*a*, 171*b*) in the direction D perpendicular to the bonding surface S1 of the circuit substrate 11. In addition, the second light-shielding portions 152 are disposed on the second surface S22 of the epitaxial structure layer 12. The second light-shielding portions 152 expose parts of area of the second surface S22 of the epitaxial structure layer 12, where the parts of area are disposed corresponding to parts of the micro LED units 121, and located between two adjacent light conversion regions 131. In this embodiment, a gap is configured between each second light-shielding portion 152 and the adjacent light conversion regions 131, so that the currents for driving the micro LED units 121 can flow from the metal conductive layer 13 to the micro LED units 121 via the gaps. This configuration can improve the lighting efficiency. In different embodiments, each second light-shielding portion 152 may connect to the adjacent light conversion regions 131, but this disclosure is not limited thereto. For example, the light-shielding structure 15 may not include the second light-shielding portions 152. The material of the light-shielding structure 15 (including the first light-shielding portion 151 and the second light-shielding portion 152) can be a conductive or insulation opaque material (e.g., a black material) for shielding or absorbing the light so as to prevent the interference between the sub-pixels (e.g., the light mixing issue).

In addition, the micro LED display device 1 of this embodiment further includes a transparent layer 16, which is disposed at one side of the light-shielding structure 15 away from the metal conductive layer 13. Herein, the transparent layer 16 covers parts of the light-shielding structure 15 (the first light-shielding portion 151) and the light filter portions 171*a* and 171*b*, and a part of the material of the transparent layer 16 fills into the light conversion regions 131, which are not configured with the light conversion layer 14 (and the light filter layer 17). The transparent layer 16 can be a transparent film, and the material thereof may include, for example, acrylic (e.g. PMMA with a density of 1.18 g/cm$^3$), epoxy (with a density of 1.1~1.4 g/cm$^3$), or polyurethane (PU), but this disclosure is not limited thereto. For example, the material of the transparent layer 16 may include inorganic materials, such as silicon oxide ($SiO_x$), titanium dioxide ($TiO_2$), aluminum oxide ($Al_2O_3$), silicon nitride ($SiN_x$), or the like. The thickness of the transparent layer 16 can be less than or equal to 20 μm, and preferably less than 0.5 μm (e.g., 0.15 μm). If the transparent layer 16 has a thinner thickness, the transparent layer 16 covers along the side walls of the light conversion regions 131, which are not configured with the light conversion structure 14 and the light filter layer 17. In other words, the transparent layer 16 forms a nonplanar surface, which is based on the geometry of the covered layers, instead of forming a planar surface in a whole. In some embodiments, the transparent layer 16 can be, for example but not limited to, an anti-reflection film, an anti-glare film, an anti-finger printing film, a waterproof and antifouling film, or an anti-scratch film, or a combination thereof, and this disclosure is not limited.

As mentioned above, when the micro LED display device 1 is enabled, for example, the first electrode 111 can have a high potential, and the second electrode 112 can have a ground potential or a low potential. The current generated by the potential difference between the first electrode 111 and the second electrode 112 (i.e., the driving voltage) can enable the corresponding micro LED units 121 to emit the corresponding red light, green light and blue light. More specifically, in the micro LED display device 1, the driving element (e.g., an active element such as TFT) of the circuit substrate 11 can control to apply different voltages through the corresponding conductive patterns and/or circuit layers, thereby making the corresponding first electrodes 111 have different high potentials. Accordingly, the micro LED units 121 can emit blue light, and then be converted to the red light and green light by the light conversion portions 141a, 141b and the light filter portions 171a, 171b. The spatial distribution of these light beams with different colors and different intensities can form an image that can be seen by viewers, so that the micro LED display device 1 can function as a full-color display device.

In the micro LED display device 1 of this embodiment, in the direction D perpendicular to the bonding surface S1 of the circuit substrate 11, the thickness d1 of the metal conductive layer 13 is greater than the thickness d2 of the epitaxial structure layer 12. In order to obtain the uniform brightness and reduce the power consumption, the micro LED display device 1 of this embodiment utilizes the thicker metal conductive layer 13 to conduct the current flowing through each micro LED unit 121 instead of electrically connecting the semiconductor layer of micro LEDs (e.g., the first type semiconductor layer 121a) to the driving substrate with the conventional metal grid. This configuration can improve the lighting efficiency of micro LED units 121, obtain the uniform brightness, and reduce the power consumption. In this embodiment, the metal conductive layer 13 has the functions of conducting and light reflecting or concentrating, thereby preventing the interference between sub-pixels. Compared with the conventional micro LED display device, the micro LED display device 1 of this embodiment can solve the issue of manufacturing process tolerance of the conventional high-resolution display device that utilizes metal grids to electrically connect the micro LEDs to the driving substrate. As a result, the micro LED display device 1 of this embodiment can meet the requirements of high resolution and have a higher manufacturing yield.

FIGS. 2A to 2G are schematic diagrams showing micro LED display devices according to different embodiments of this disclosure.

Figure 2A:
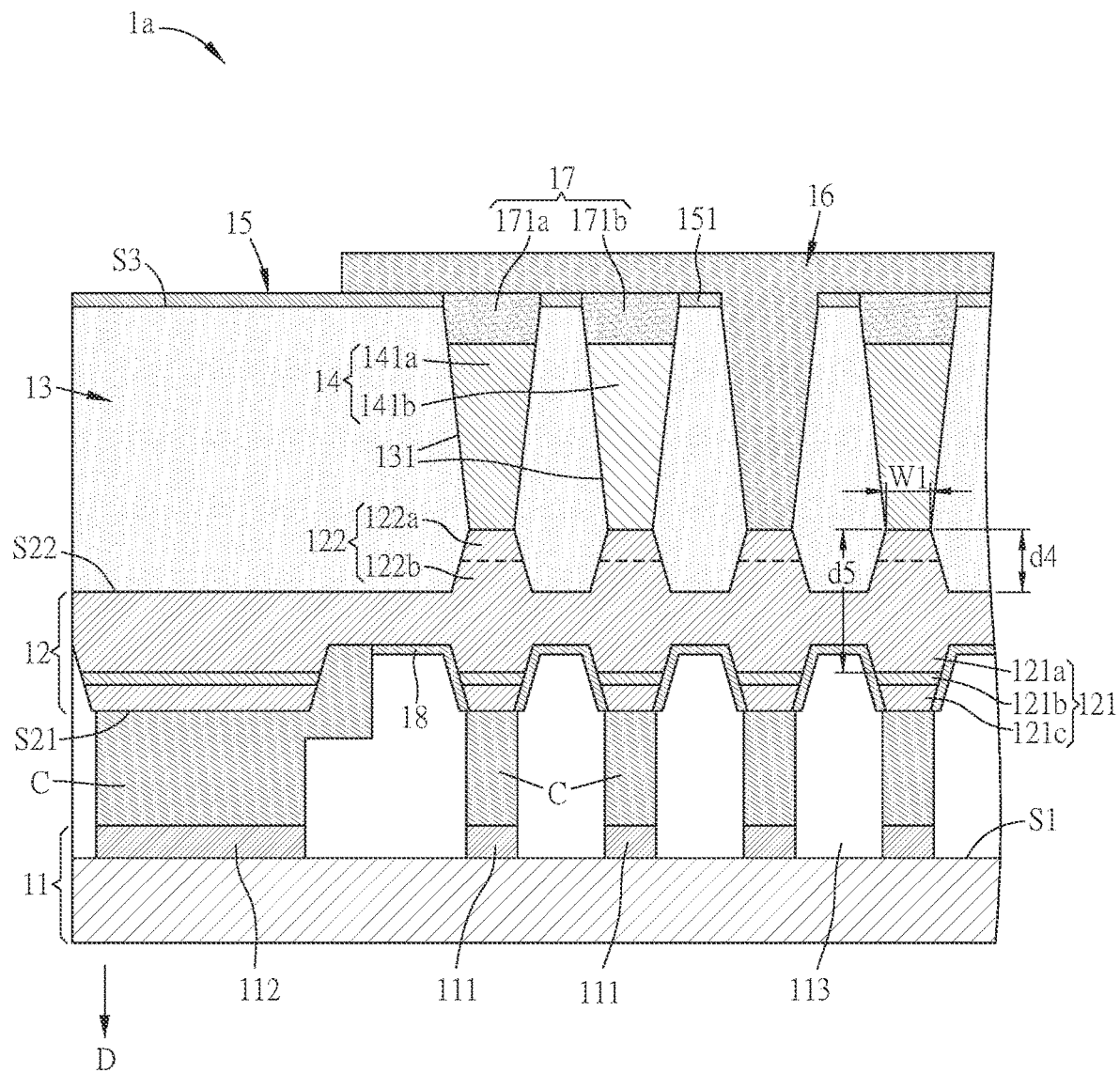
FIGS. 2A to 2I are schematic diagrams showing micro LED display devices according to different embodiments of this disclosure.

As shown in FIG. 2A, the component configurations and connections of the micro LED display device 1a of this embodiment are mostly the same as those of the previous embodiment. Different from the previous embodiment, in the micro LED display device 1a of this embodiment, the epitaxial structure layer 12 further includes a plurality of protrusion portions 122 protruding toward the light conversion layer 14, the protrusion portions 122 correspond to the light conversion regions 131, respectively, and each of the protrusion portions 122 is disposed corresponding to one of the micro LED units 121. Specifically, one protruding portion 122 is disposed corresponding to one micro LED unit 121 and one light conversion region 131. In this embodiment, the protrusion portions 122 are isolated from each other. To be noted, the protrusion portions 122 are connected to a common first type semiconductor layer 121a of the epitaxial structure layer 12. The configuration of the protrusion portions 122 is to reduce the light shielding and to increase the contact areas between the epitaxial structure layer 12 and the metal conductive layer 13 (for increasing the current). More specifically, the light conversion portions 141a and 141b contact the corresponding protrusion portions 122, respectively. The shape of the protrusion portion 122 is, for example, a cone shape, and the cross-sectional shape thereof is, for example, a polygonal shape (e.g., trapezoid). To be noted, this disclosure is not limited thereto. For example, the shape of the light conversion portions 141a and 141b can be an inverted cone. Since the cross-sectional shape of the protrusion portion 122 is a trapezoid shape and the cross-sectional shape of the light conversion portion 131 is correspondingly an inverted trapezoid shape (one trapezoid shape corresponds to one inverted trapezoid shape), the lighting efficiency of the micro LED units 121 can be increased. In some embodiments, the height of the protrusion portions 122 is greater than 2 μm.

In this embodiment, the top of each protrusion portion 122 is a nonconductive undoped semiconductor layer 122a, and the bottom of each protrusion portion 122 is a conductive doped semiconductor layer 122b. The undoped semiconductor layer 122a is, for example, undoped gallium nitride (u-GaN), and the doped semiconductor layer 122b can have the same material as the first type semiconductor layer 121a (e.g., n-type gallium nitride (n-GaN)). In different embodiments, the entire protrusion portion 122 is made of conductive doped semiconductor, but this disclosure is not limited thereto. In addition, the light-shielding structure 15 includes the first light-shielding portion 151 but does not include the second light-shielding portion 152.

In some embodiments, the conductivity of the doped semiconductor layer 122b (e.g., n-GaN) is about $10^1 \sim 10^3$ S/m, and the conductivity of metal is about $10^7$ S/m. Thus, the metal conductive layer 13, which is made of metal, will provide the conductive path for the micro LED unit 121. In some embodiments, the thickness of the metal grid is between 2 μm and 20 μm. Since the micro display device usually needs a high frame refresh rate to satisfy the application requirement, the metal conductive layer 13 with high conductivity and increased thickness is used to assist the epitaxial structure layer 12 to increase the current transmission speed, and to provide the light reflection property, thereby increasing the lighting efficiency and improving the display brightness and quality.

In some embodiments, the thickness of the light conversion portions 141a and 141b can be greater than or equal to 2 μm, and be less than or equal to the thickness of the metal grid. In some embodiments, the thickness d4 of the protrusion portions 122 is between 2 μm and the thickness d5 (2 μm≤d4≤d5), wherein the thickness d5 is defined between the light-emitting layer 121b and the top of the protrusion portion 122. In some embodiments, the thickness d5 between the light-emitting layer 121b and the top of the protrusion portion 122 is less than or equal to 4 μm. In some embodiments, the width W1 of the top of the protrusion portion 122 is between 0.3 µm and 7 µm (0.3 µm≤W1≤7 µm). In some embodiments, the ratio of the width W1 of the top of the protrusion portion 122 to the thickness d4 of the protrusion portion 122 is between 0.075 and 3.5 (0.075≤(W1/d4)≤3.5). In some embodiments, the ratio of the width W1 of the top of the protrusion portion 122 to the thickness of the metal grid is between 0.015 and 7 (0.015≤(W1/thickness of metal grid)≤7).

Figure 2B:
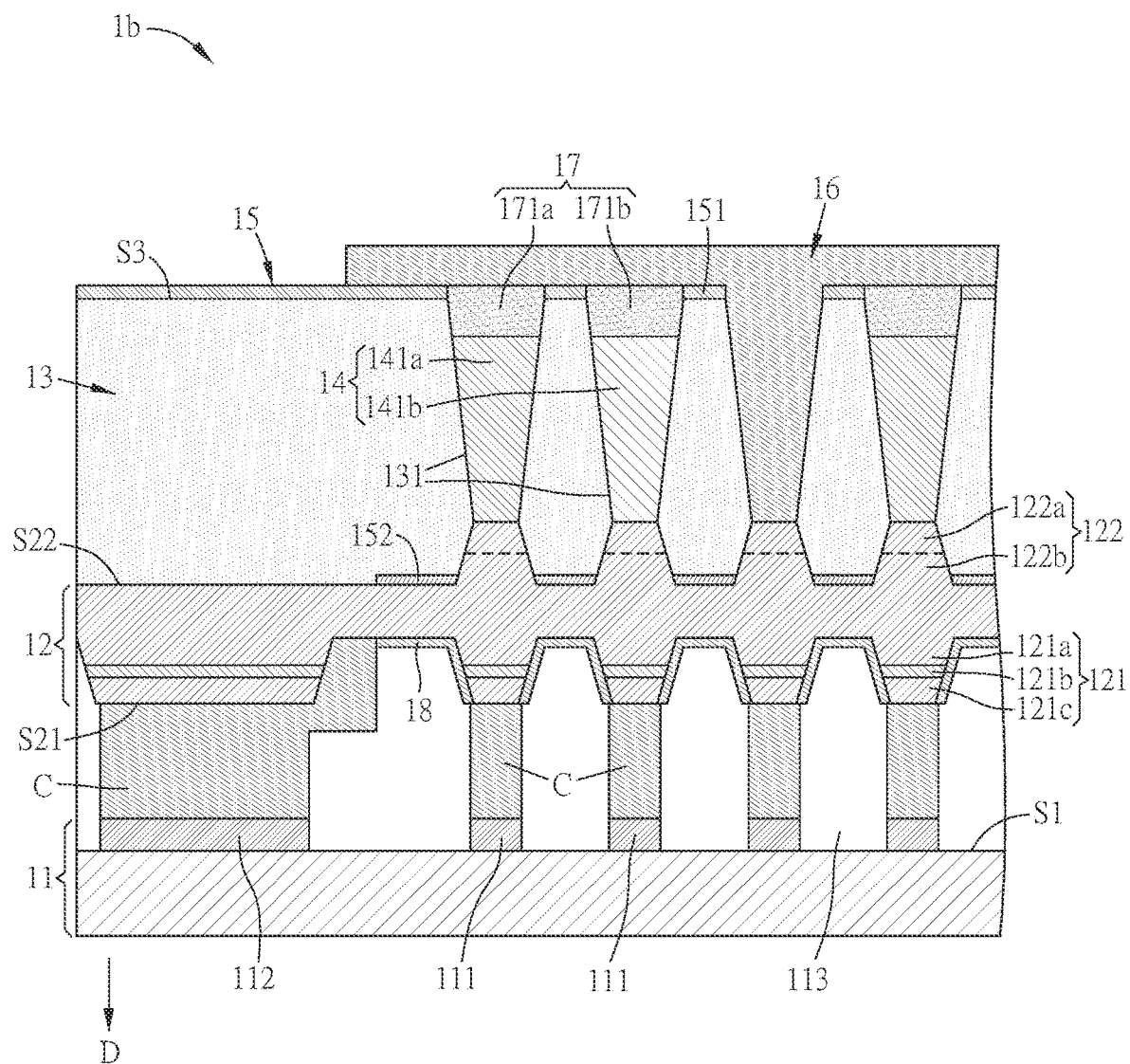

As shown in FIG. 2B, the component configurations and connections of the micro LED display device 1b of this embodiment are mostly the same as those of the previous embodiment. Different from the previous embodiment, in the micro LED display device 1b of this embodiment, the light-shielding structure 15 further includes the second light-shielding portion 152. In this embodiment, the second light-shielding portions 152 are disposed around the peripheries of the protrusion portions 122, and each second light-shielding portion 152 is connected to the adjacent protrusion portion 122.

Figure 2C:
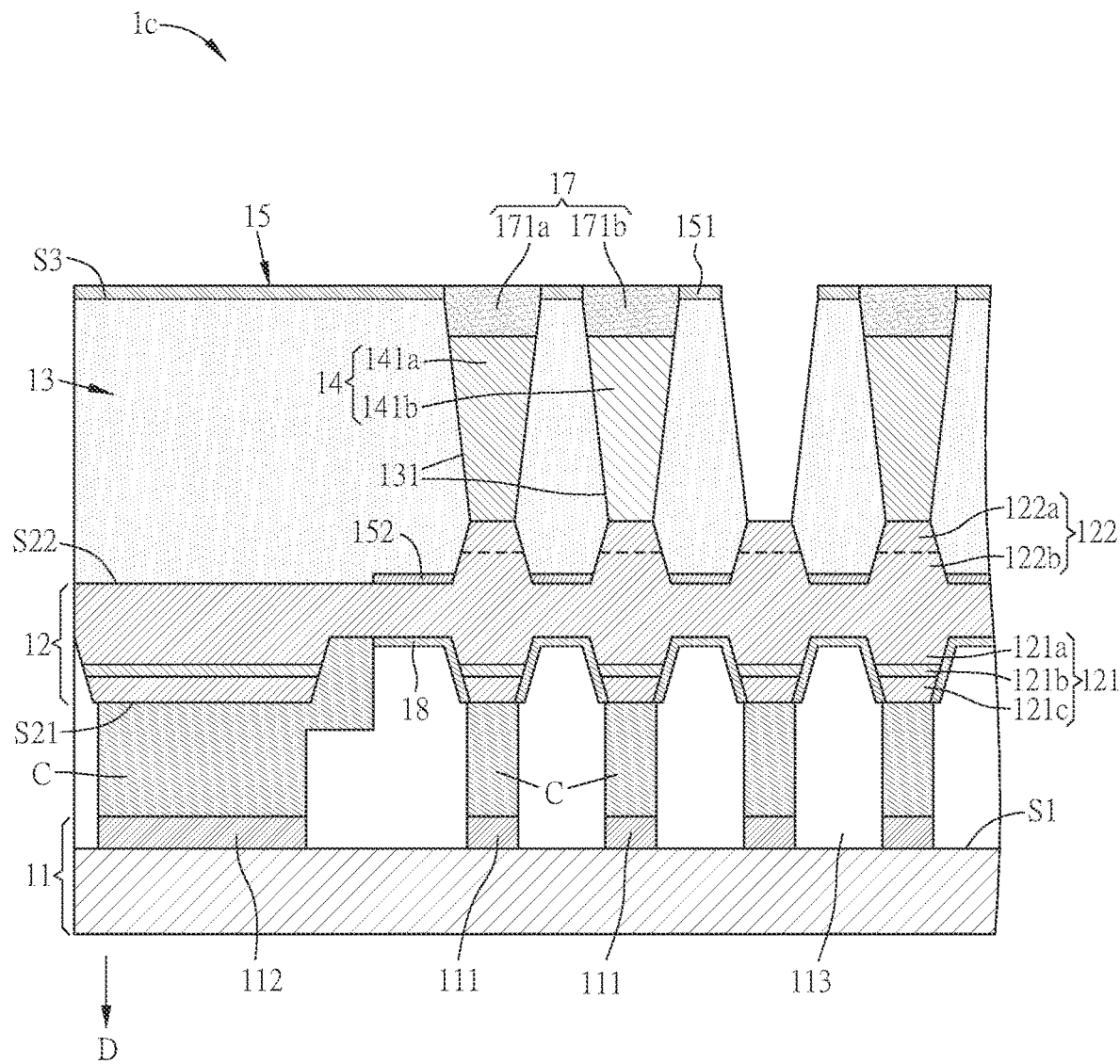

As shown in FIG. 2C, the component configurations and connections of the micro LED display device 1c of this embodiment are mostly the same as those of the previous embodiment. Different from the previous embodiment, the micro LED display device 1c of this embodiment does not include the transparent layer 16. Accordingly, the light conversion regions 131, which are not configured with the light conversion layer 14 (and the light filter layer 17), are not filled with any material. In some embodiments, light conversion regions 131, which are not configured with the light conversion layer 14 (and the light filter layer 17), can be filled with other materials such as optical clear adhesive (OCA), but this disclosure is not limited thereto.

Figure 2D:
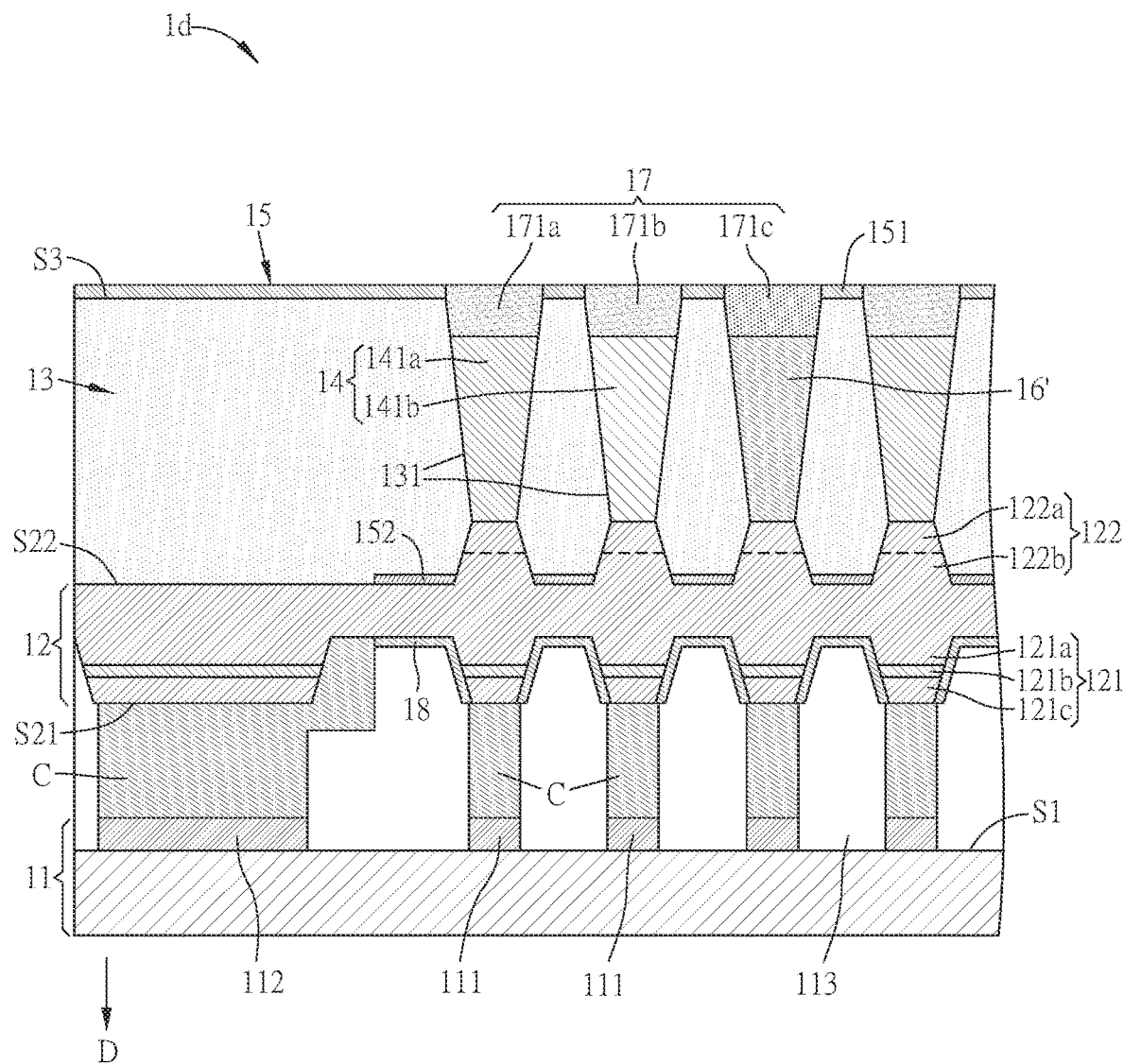

As shown in FIG. 2D, the component configurations and connections of the micro LED display device 1d of this embodiment are mostly the same as those of the previous embodiment. Different from the previous embodiment, in the micro LED display device 1d of this embodiment, a part of the light conversion regions 131 is filled with the transparent layer 16', and the light filter layer 17 further includes the light filter portion 171c containing blue light filter material. In addition, the light filter portion 171c is overlapped with the light transparent layer 16'. That is, the light conversion region 131 in the blue sub-pixel is also configured with the corresponding blue light filter portion 171c, thereby further improving the light uniformity of wavelength.

Figure 2E:
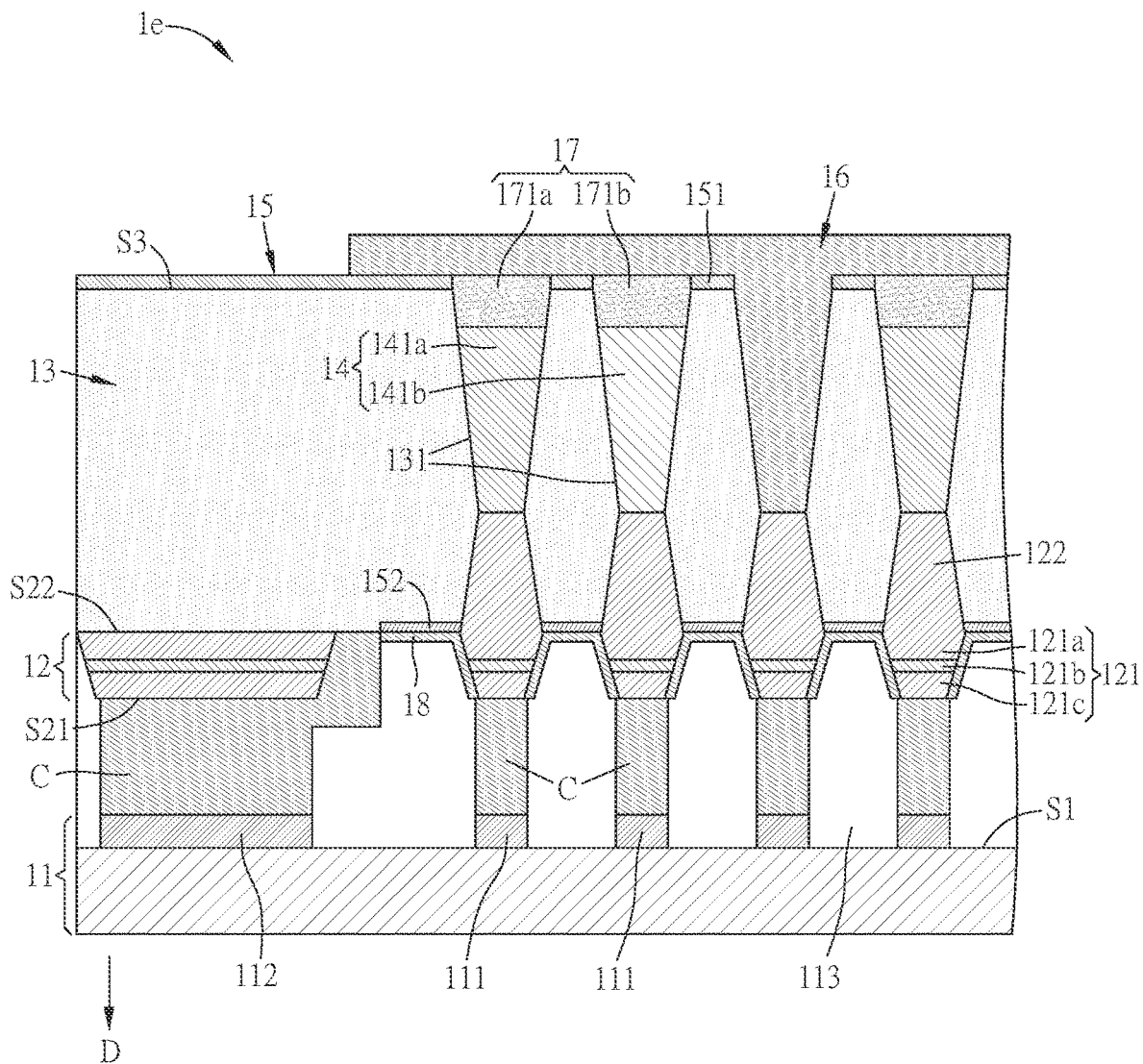

As shown in FIG. 2E, the component configurations and connections of the micro LED display device 1e of this embodiment are mostly the same as those of the previous embodiment. Different from the previous embodiment, in the micro LED display device 1e of this embodiment, the protrusion portions 122 have a taller height and isolated from each other. Each of the protrusion portions 122 directly connects to the first type semiconductor layer 121a of the corresponding micro LED unit 121, but does not connect to the first type semiconductor layer 121a of the adjacent micro LED unit 121. The first type semiconductor layers 121a of the adjacent micro LED units 121 are isolated from each other, and the thickness d1 of the metal conductive layer 13 is thicker. The taller protrusion portions 122 and the thicker metal conductive layer 13 can improve the current transmission, thereby increasing the lighting efficiency of the micro LED units 121. In addition, the second light-shielding portion 152 directly contacts the insulation layer 18. In other words, the light emitted from any micro LED unit 121 does not interfere the neighboring micro LED units 121, thereby further improving the display quality.

Figure 2F:
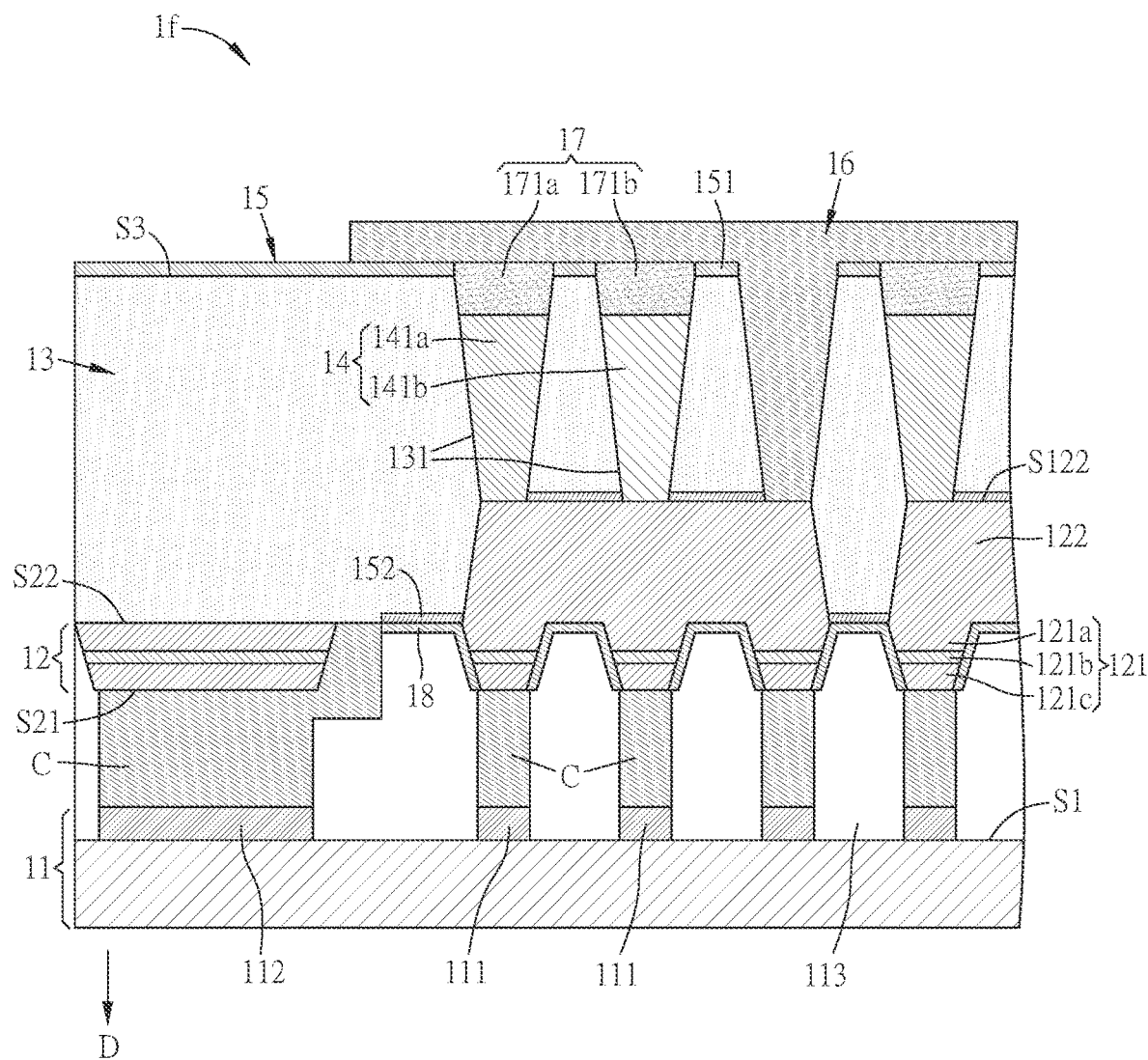

As shown in FIG. 2F, the component configurations and connections of the micro LED display device 1f of this embodiment are mostly the same as those of the previous embodiment. Different from the previous embodiment, in the micro LED display device 1f of this embodiment, three protrusion portions 122 in one pixel P are connected to each other (forming a single component (122)), but two adjacent protrusion portions 122 in two adjacent pixels, respectively, are isolated from each other. In this embodiment, the protrusion portions 122 has a planar surface S122. This configuration can increase the contact area between the protrusion portions 122 and the light conversion regions 131, thereby increasing the alignment accuracy and further improving the manufacturing yield.

Figure 2G:
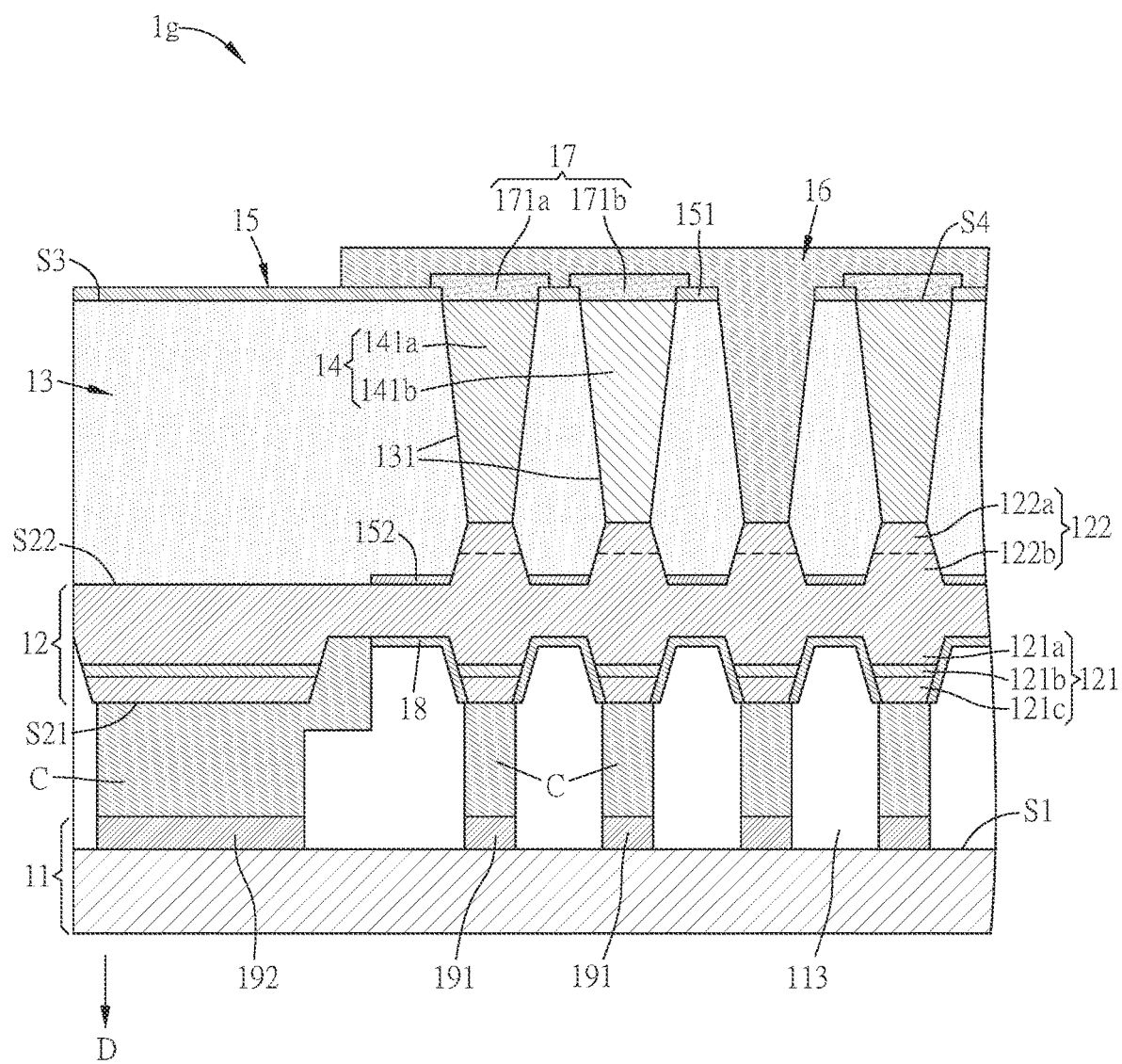

As shown in FIG. 2G, the component configurations and connections of the micro LED display device 1g of this embodiment are mostly the same as those of the previous embodiment. Different from the previous embodiment, in the micro LED display device 1g of this embodiment, the light conversion layer 14 includes a top surface S4 away from the epitaxial structure layer 12, and the top surface S4 is aligned with the upper surface S3 of the metal conductive layer 13 away from the epitaxial structure layer 12. In other words, in the step of filling the material of the light conversion portions 141a and 141b, the material of the light conversion portions 141a and 141b and the upper surface S3 of the metal conductive layer 13 form a planar surface. Afterwards, the corresponding light filter portions 171a and 171b as well as the transparent layer 16 are formed thereon.

Figure 2H:
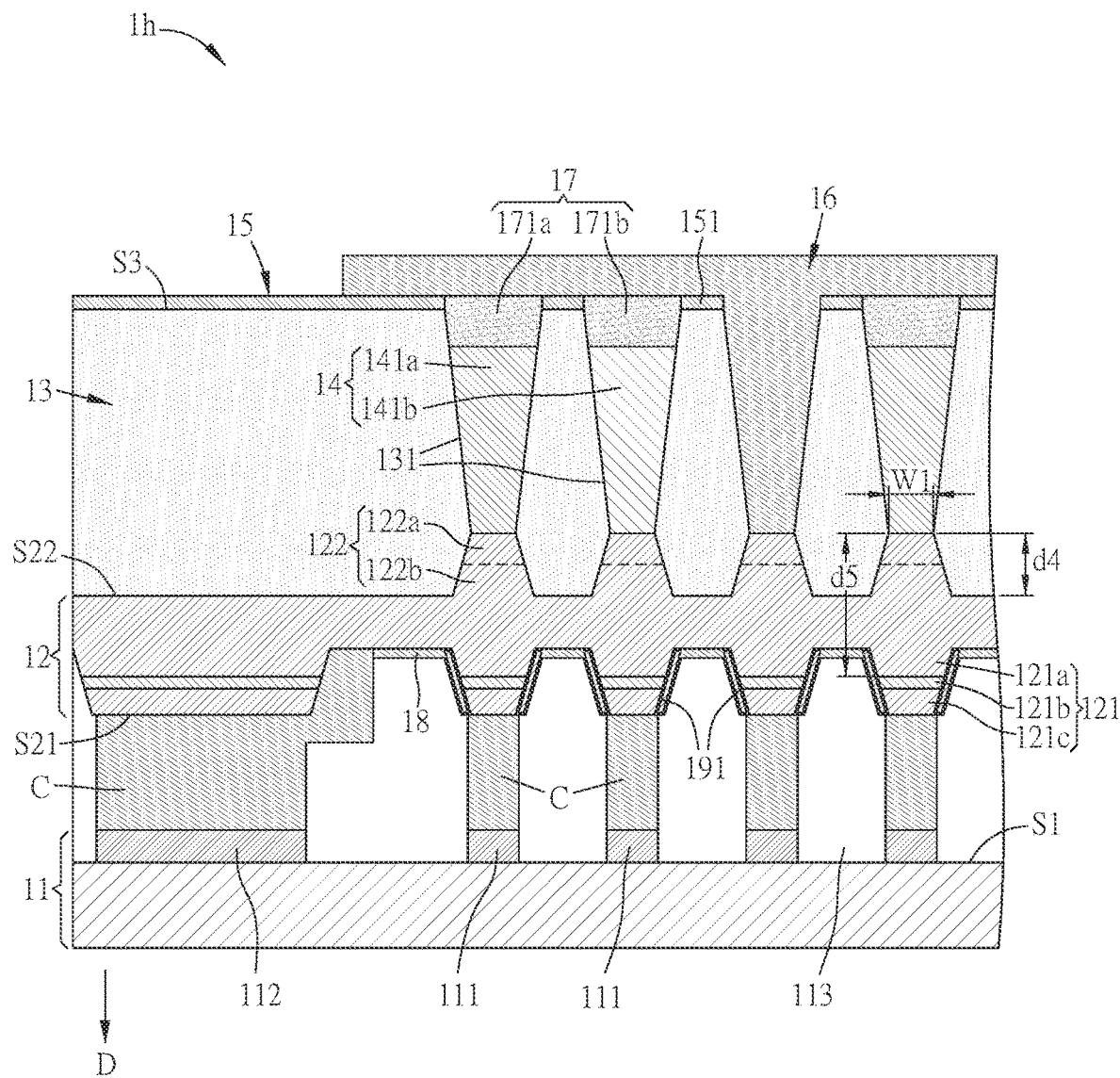

As shown in FIG. 2H, the component configurations and connections of the micro LED display device 1h of this embodiment are mostly the same as those of the previous embodiment. Different from the previous embodiment, the micro LED display device 1h of this embodiment further includes a plurality of light-reflective structures 191, and the light-reflective structures 191 are correspondingly disposed on sidewalls of the micro LED units 121, respectively. Each of the light-reflective structures 191 is configured to reflect the light emitted from the corresponding micro LED unit 121 toward the corresponding light conversion layer 14, thereby increasing the light utility rate. In this embodiment, each light-reflective structure 191 is disposed around the light-emitting layer 121b of the corresponding micro LED unit 121. In some embodiments, the light-reflective structures 191 include titanium (Ti), chromium (Cr), aluminum (Al), copper (Cu), silver (Ag), gold (Au) or nickel (Ni), or a combination thereof. Herein, the insulation layer 18 may be used to cover the light-reflective structures 191 to prevent the short-circuiting between the first type semiconductor layer 121a and the second type semiconductor layer 121c. In some embodiments, each of the light-reflective structures 191 disposes around the corresponding first type semiconductor layer 121a, but does not extend to the second type semiconductor layer 121c, so it is unnecessary to provide the insulation layer 18 to cover the light reflection structures 191 since there is no conduction between the first type semiconductor layer 121a and the second type semiconductor layer 121c via the light reflection structure 191. In some embodiments, the thickness of the light-reflective structures 191 can be between 0.05 and 0.3 µm. The light-reflective structures 191 of this embodiment can also be applied to other embodiments of this disclosure.

Figure 2I:
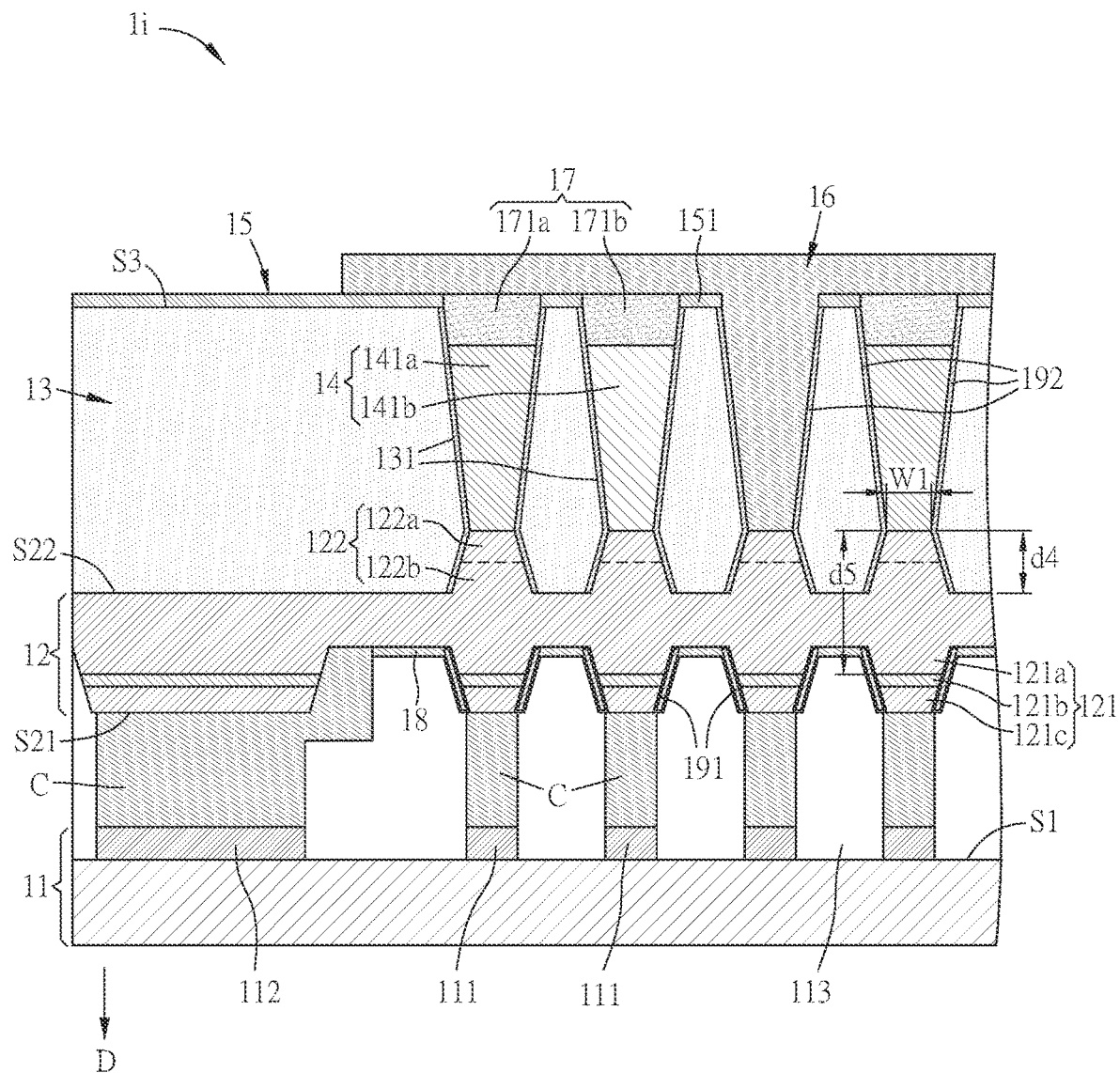

As shown in FIG. 2I, the component configurations and connections of the micro LED display device 1i of this embodiment are mostly the same as those of the previous embodiment. Different from the previous embodiment, the micro LED display device 1*i* of this embodiment further includes a light-reflective layer 192 correspondingly disposed at the lateral sides of each of the light conversion regions 131. Herein, the light-reflective layer 192 is configured to reflect the light entering the light conversion layer 14 so as to increasing the light utility rate. In this embodiment, the light-reflective layer 192 is disposed around the lateral sides of each light conversion region 131, and extends from the lateral sides of each light conversion region 131 to an outer surface of each protrusion portion 122. In this embodiment, the reflectivity of the light-reflective layer 192 is greater than that of the metal conductive layer 13. In some embodiments, the light-reflective layer 192 includes titanium (Ti), chromium (Cr), aluminum (Al), or silver (Ag), or a combination thereof. In some embodiments, the thickness of the light-reflective layer 192 can be between 0.05 and 0.3 μm. The light-reflective layer 192 of this embodiment can also be applied to other embodiments of this disclosure.

In summary, the micro LED display device of this disclosure utilizes a thicker metal conductive layer to conduct the current flowing through each micro LED unit instead of utilizing the conventional metal grid to electrically connect the micro LED units to the driving substrate. This configuration can improve the lighting efficiency of micro LED units, obtain the uniform brightness, and reduce the power consumption. Compared with the conventional art that utilizes the metal grid to electrically connect the micro LED units to the driving substrate, the micro LED display device of this disclosure can meet the requirements of high resolution and have a higher manufacturing yield.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. A micro LED display device, comprising:
   a circuit substrate having a bonding surface;
   an epitaxial structure layer disposed on the bonding surface of the circuit substrate, wherein the epitaxial structure layer comprises a first surface facing the circuit substrate, a second surface away from the circuit substrate, and a plurality of micro LED units separated from each other, the micro LED units are located on the first surface and electrically connected to the circuit substrate, and the circuit substrate controls the micro LED units to emit light;
   a metal conductive layer disposed on the second surface of the epitaxial structure layer and directly contacting the epitaxial structure layer, wherein the metal conductive layer defines a plurality of light conversion regions separated from each other, and each of the light conversion regions corresponds to one of the micro LED units;
   a light conversion layer disposed in a part of the light conversion regions and configured to convert wavelengths of lights emitted from the corresponding micro LED units; and
   a light-shielding structure having a plurality of first light-shielding portions disposed on the metal conductive layer, wherein the first light-shielding portions do not cover the light conversion regions;
   wherein, in a direction perpendicular to the bonding surface of the circuit substrate, a thickness of the metal conductive layer is greater than a thickness of the epitaxial structure layer.

2. The micro LED display device of claim 1, wherein the second surface of the epitaxial structure layer is a planar surface.

3. The micro LED display device of claim 1, wherein each of the light conversion regions is a through hole formed in the metal conductive layer.

4. The micro LED display device of claim 3, wherein the through hole is overlapped with the corresponding micro LED unit in the direction perpendicular to the bonding surface, and the light emitted from the micro LED unit passes through the through hole to display an image.

5. The micro LED display device of claim 1, wherein the epitaxial structure layer comprises a continuous semiconductor layer commonly applied to the micro LED units.

6. The micro LED display device of claim 1, wherein the circuit substrate further comprises a plurality of conductive electrodes, and one of the conductive electrodes is electrically connected to one of the micro LED units via a conductive member.

7. The micro LED display device of claim 6, wherein the circuit substrate outputs a common-electrode signal to the metal conductive layer through the conductive member and the epitaxial structure layer.

8. The micro LED display device of claim 1, wherein the light-shielding structure further comprises a plurality of second light-shielding portions disposed on the second surface of the epitaxial structure layer, and the second light-shielding portions expose parts of area of the second surface of the epitaxial structure layer corresponding to parts of the micro LED units.

9. The micro LED display device of claim 8, wherein a gap is configured between one of the second light-shielding portions and one of the light conversion regions adjacent to the second light-shielding portion.

10. The micro LED display device of claim 1, further comprising:
    a transparent layer disposed at one side of the light-shielding structure away from the metal conductive layer.

11. The micro LED display device of claim 10, wherein a part of a material of the transparent layer is filled in the light conversion regions, which are not configured with the light conversion layer.

12. The micro LED display device of claim 1, further comprising:
    a light filter layer disposed at one side of the light conversion layer away from the epitaxial structure layer, wherein the light filter layer comprises a plurality of light filter portions, the light conversion layer comprises a plurality of light conversion portions, and the light filter portions are disposed corresponding to the light conversion portions, respectively.

13. The micro LED display device of claim 1, wherein the light conversion layer comprises a plurality of light conversion portions, and a cross-sectional shape of each of the light conversion portions is an inverted trapezoid shape.

14. The micro LED display device of claim 1, wherein the epitaxial structure layer further comprises a plurality of protrusion portions protruding toward the light conversion layer, and each of the protrusion portions is disposed corresponding to one of the micro LED units.

15. The micro LED display device of claim 14, wherein the light conversion layer comprises a plurality of light conversion portions, a cross-sectional shape of each of the light conversion portions is an inverted trapezoid shape, and a cross-sectional shape of each of the protrusion portions is a trapezoid shape.

16. The micro LED display device of claim 14, wherein the protrusion portions are isolated from each other.

17. The micro LED display device of claim 14, wherein the protrusion portions in the same one pixel are connected to each other, and adjacent two of the protrusion portions in two adjacent pixels, respectively, are isolated from each other.

18. The micro LED display device of claim 1, wherein the light conversion layer comprises a top surface away from the epitaxial structure layer, the metal conductive layer comprises an upper surface away from the epitaxial structure layer, and the top surface is aligned with the upper surface.

19. The micro LED display device of claim 1, further comprising:
a plurality of light-reflective structures correspondingly disposed on sidewalls of the micro LED units, respectively, wherein each of the light-reflective structures is configured to reflect a light emitted from the corresponding micro LED unit.

20. The micro LED display device of claim 19, wherein each of the light-reflective structures is disposed around a light-emitting layer of the corresponding micro LED unit.

21. The micro LED display device of claim 1, further comprising:
a light-reflective layer correspondingly disposed at lateral sides of each of the light conversion regions.

22. The micro LED display device of claim 21, wherein the epitaxial structure layer further comprises a plurality of protrusion portions protruding toward the light conversion layer, each of the protrusion portions is disposed corresponding to one of the micro LED units, and the light-reflective layer extends from the lateral sides of each of the light conversion regions to an outer surface of each of the protrusion portions.

23. The micro LED display device of claim 21, wherein a reflectivity of the light-reflective layer is greater than a reflectivity of the metal conductive layer.

* * * * *